(12) United States Patent
Kobayashi et al.

(10) Patent No.: US 9,607,874 B2
(45) Date of Patent: Mar. 28, 2017

(54) PLASMA PROCESSING APPARATUS

(71) Applicant: Hitachi High-Technologies Corporation, Minato-ku, Tokyo (JP)

(72) Inventors: Hiroyuki Kobayashi, Tokyo (JP); Tomoyuki Tamura, Tokyo (JP); Masaki Ishiguro, Tokyo (JP); Shigeru Shirayone, Tokyo (JP); Kazuyuki Ikenaga, Tokyo (JP); Makoto Nawata, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/851,996

(22) Filed: Sep. 11, 2015

(65) Prior Publication Data
US 2016/0079043 A1 Mar. 17, 2016

(30) Foreign Application Priority Data

Sep. 11, 2014 (JP) .................................. 2014-184744

(51) Int. Cl.
| | |
|---|---|
| *H01L 21/302* | (2006.01) |
| *H01L 21/461* | (2006.01) |
| *H01L 21/683* | (2006.01) |
| *H01L 21/3065* | (2006.01) |
| *H01L 21/311* | (2006.01) |
| *H01J 37/32* | (2006.01) |

(52) U.S. Cl.
CPC ...... *H01L 21/6833* (2013.01); *H01J 37/3244* (2013.01); *H01J 37/32477* (2013.01); *H01J 37/32504* (2013.01); *H01J 37/32577* (2013.01); *H01L 21/3065* (2013.01); *H01L 21/31116* (2013.01)

(58) Field of Classification Search
CPC ......... H01L 21/32447; H01L 21/32504; H01L 21/32577
USPC ....................................................... 438/714
See application file for complete search history.

(56) References Cited

FOREIGN PATENT DOCUMENTS

JP          2013-229445 A        11/2013

OTHER PUBLICATIONS

Kobayashi, H.; "Behavior of Dust Particles in Plasma Etching Apparatus"; Japanese Journal of Applied Physics 50 (2011) 08JE01.

*Primary Examiner* — Roberts Culbert
(74) *Attorney, Agent, or Firm* — Miles & Stockbridge P.C.

(57) ABSTRACT

A plasma processing apparatus includes a stage in a processing chamber where plasma is formed, a wafer to be processed, and an electrode arranged at an upper part of the stage and supplied with power to electrostatically attract and hold the wafer on the stage, and consecutively processing a plurality of wafers one by one. There are plural processing steps of conducting processing using the plasma under different conditions and there are plural periods when formation of plasma is stopped between the processing steps. An inner wall of the processing chamber is coated before starting the processing of any wafer, and voltage supplied to the electrode is changed according to a balance of respective polarities of particles floating and charged in the processing chamber in each period when formation of plasma is stopped.

4 Claims, 9 Drawing Sheets

FIG. 3
(a)
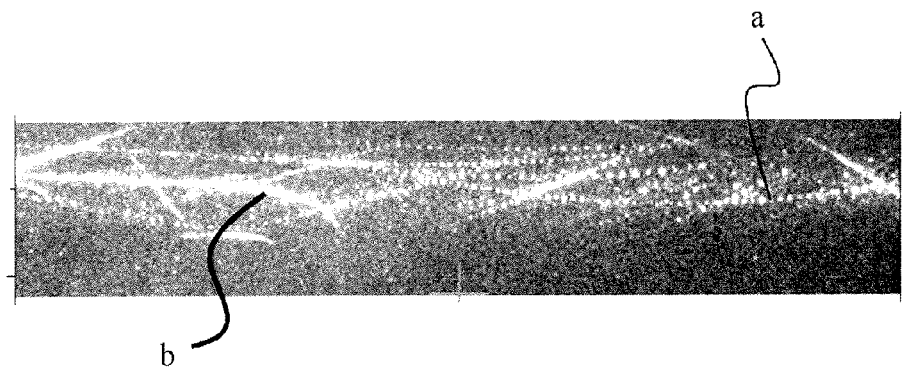
(b)
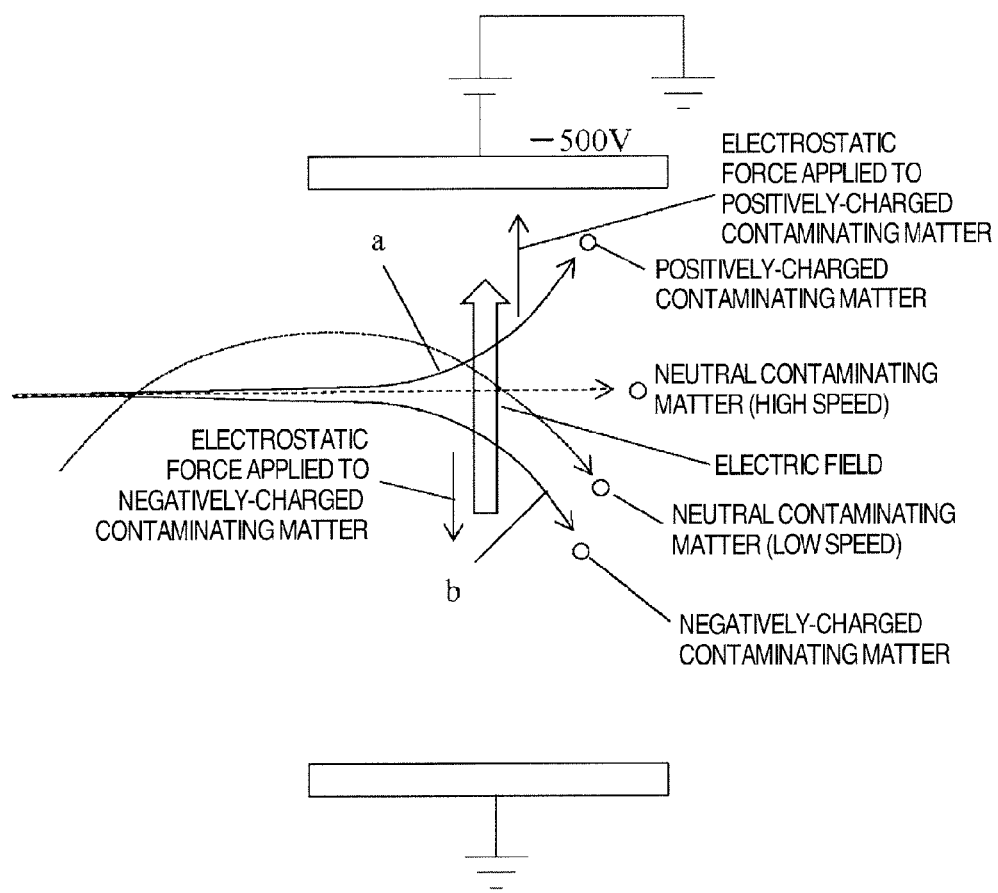

FIG. 5
(a) AFTER INNER WALL COATING PROCESSING
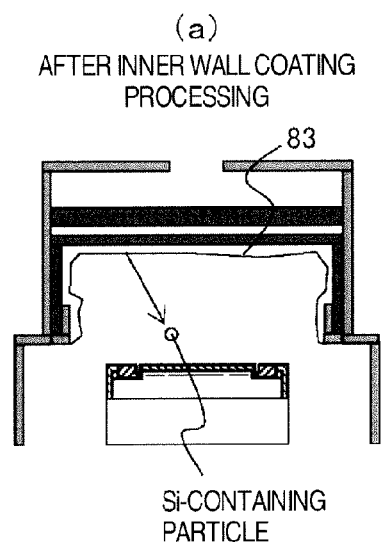
(b) INTER-STEP 1
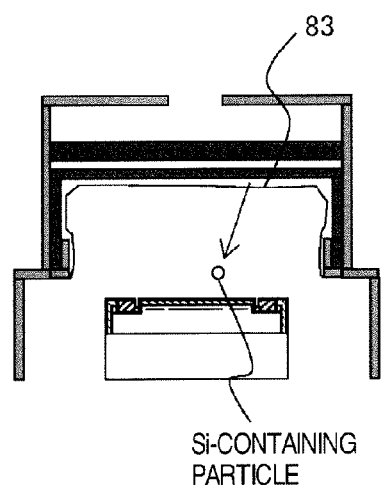
FIG. 6
(a) INTER-STEP 2
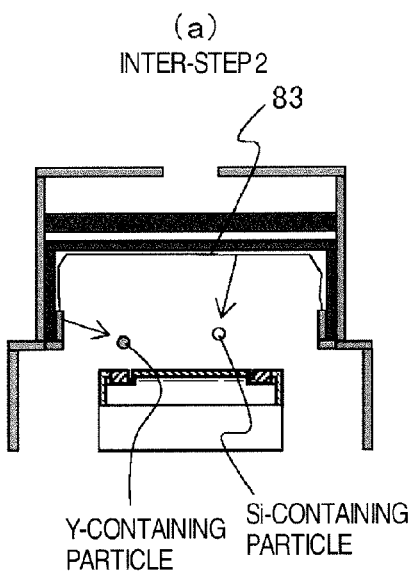
(b) INTER-STEP 3
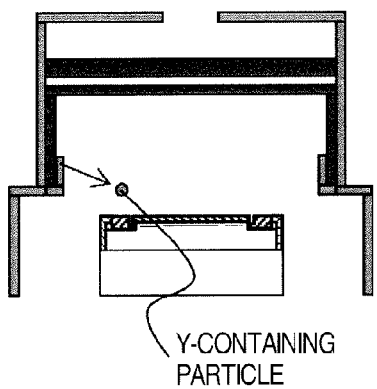

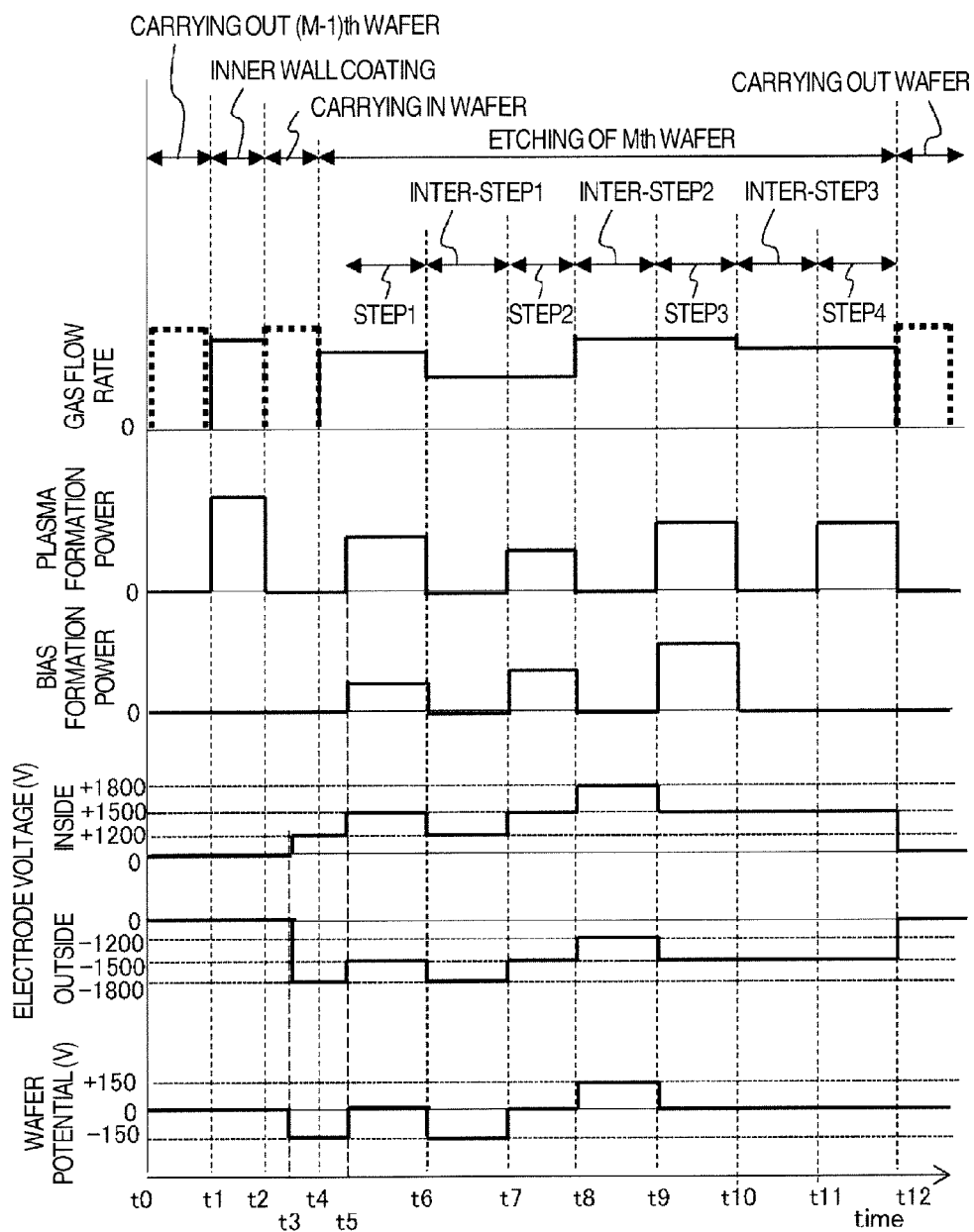

FIG. 8

| INTER-STEP | PROCESSING STEP RIGHT BEFORE INTER-STEP | | | | | |
|---|---|---|---|---|---|---|
| | GAS TYPE CONDITION | | | BIAS FORMATION POWER | | |
| | PROCESS GAS | WEAR OF QUARTZ MEMBER | AMOUNT OF OCCURRENCE OF Y-CONTAINING PARTICLE FROM SURFACE OF QUARTZ MEMBER | WAFER BIAS | WEAR OF EARTH MEMBER | AMOUNT OF OCCURRENCE OF Y-CONTAINING PARTICLE FROM EARTH |
| 1 | F-BASED | LARGE | MANY | SMALL | SMALL | FEW |
| 2 | NOT F-BASED | SMALL | FEW | LARGE | LARGE | MANY |
| 3 | F-BASED | LARGE | MANY | LARGE | LARGE | MANY |

← NEGATIVELY-CHARGED RATIO IS LARGE

← POSITIVELY-CHARGED RATIO IS LARGE

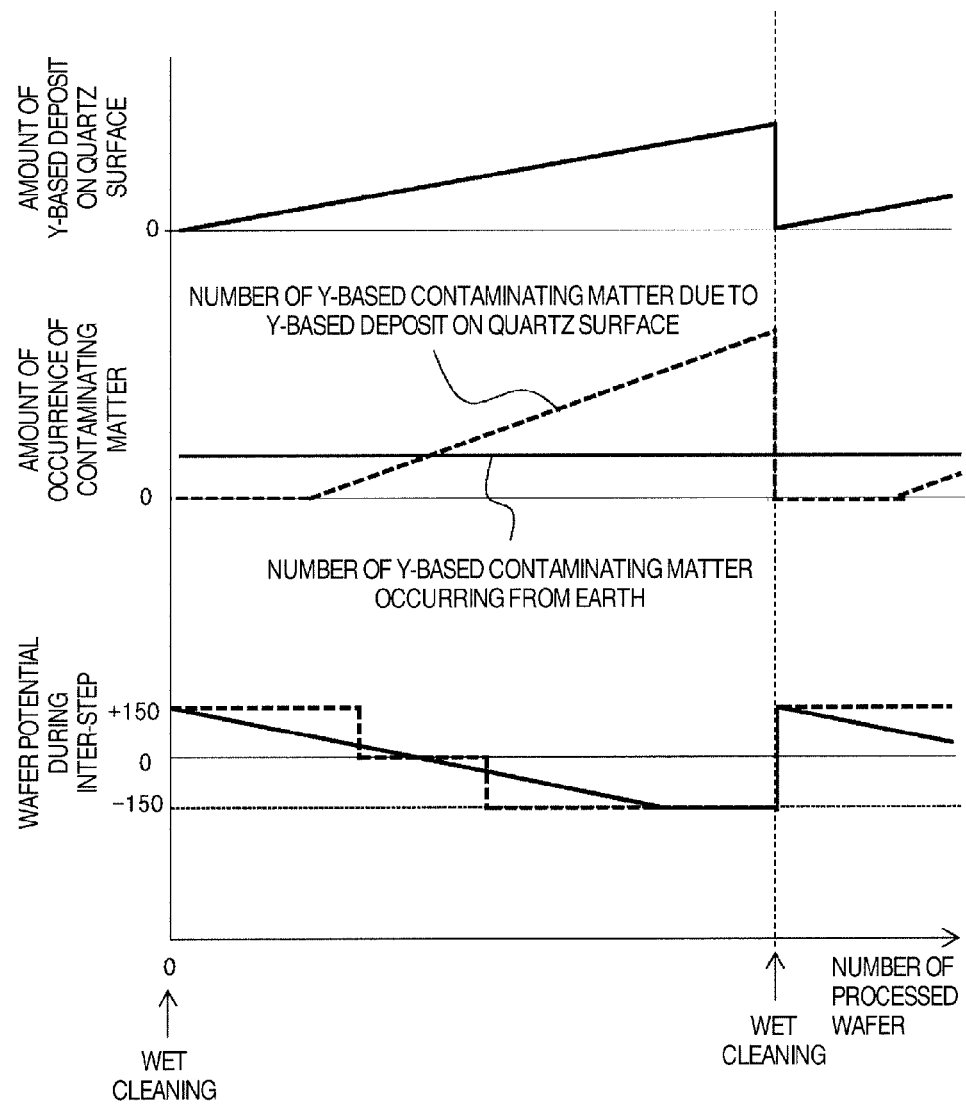

FIG. 10

| WAFER POTENTIAL (V) (INSIDE ELECTRODE + OUTSIDE ELECTRODE)/2 | | | | DETECTION RESULT OF NUMBER OF WAFER ATTACHED PARTICLE (RELATIVE VALUE) |
|---|---|---|---|---|
| BEFORE DISCHARGE | BETWEEN STEPS 1 AND 2 | BETWEEN STEPS 2 AND 3 | BETWEEN STEPS 3 AND 4 | |
| 0 | 0 | 0 | 0 | 100 |
| −100 | 0 | 0 | 0 | 95 |
| +100 | 0 | 0 | 0 | 110 |
| 0 | −100 | 0 | 0 | 80 |
| 0 | +100 | 0 | 0 | 150 |
| 0 | 0 | −100 | 0 | 130 |
| 0 | 0 | +100 | 0 | 140 |
| 0 | 0 | 0 | −100 | 130 |
| 0 | 0 | 0 | +100 | 90 |

BEFORE DISCHARGE → −100 V: NUMBER OF CONTAMINATING MATTER: -5
BETWEEN STEPS 1 AND 2 → −100 V: NUMBER OF CONTAMINATING MATTER: -20
BETWEEN STEPS 2 AND 3 → 0 V: NUMBER OF CONTAMINATING MATTER: Ä}0
BETWEEN STEPS 3 AND 4 → +100 V: NUMBER OF CONTAMINATING MATTER: -10
TOTAL NUMBER OF CONTAMINATING MATTER: 65 (-35)

PLASMA PROCESSING APPARATUS

BACKGROUND OF THE INVENTION

The present invention relates to a plasma processing apparatus for processing a processing object wafer mounted on a sample stage arranged in a processing chamber inside a vacuum chamber by using plasma formed in the processing chamber, and in particular, to a plasma processing apparatus including an electrode for electrostatically attracting a wafer onto a sample stage.

Plasma etching is widely used in a process of manufacturing semiconductor devices such as DRAMs and microprocessors. As one of problems of processing semiconductor devices by using plasma, reducing the number of dust particles (hereinafter also simply called dust) attaching to a wafer is cited. If dust particles attach onto a fine pattern in etching of a semiconductor device, the etching is locally blocked at that part, causing a pattern defect such as disconnection and a short circuit.

In order to prevent this, various measures to reduce the number of dusts attaching to a wafer have been devised in the past. For example, means to reduce the quantity of dusts attaching to a wafer is broadly divided into means to reduce the quantity of dusts peeled off from an inner wall of a processing chamber and means to prevent dusts that have been peeled off from the inner wall from dropping onto the wafer by appropriately controlling transportation of the dusts in the processing chamber.

Especially, as for the latter means, it is effective to actively control transport of the dust particles that have gas viscous force or are charged by using electrostatic force. On the other hand, as described in JP-A-2013-229445, in order to prevent charged dusts from coming close to a wafer, it is devised to make potential of the wafer (or relative potential to a component in the processing chamber) zero so that electrostatic force will not work between the dusts and the wafer.

As an example of such a conventional technique, a technique disclosed in the JP-A-2013-229445 is known. The conventional technique discloses a configuration to apply voltage to a focus ring of an electrostatic chuck which is arranged in a processing chamber and on which a substrate W to be processed is mounted before carrying the substrate W to be processed into the processing chamber so that potential difference between the focus ring and the substrate W to be processed which is carried into will be small. The conventional technique is a technique, by such a configuration, to try to prevent fine particles which have attached to the focus ring due to potential difference between the focus ring and the substrate W to be processed from moving and attaching to an upper surface of the substrate W to be processed.

SUMMARY OF THE INVENTION

The above-described conventional technique has caused problems because it did not fully take the following points into consideration.

Namely, when etching includes a plurality of steps conducted under different processing conditions (so-called processing recipes), there are cases where discharge is once halted between the previous and next steps. For example, if types of process gas are very different between an Nth discharge step and an (N+1)th discharge step, there are cases where plasma is not produced so as not to make progress in processing of a processing object film of a film structure arranged beforehand on a wafer surface until process gas in the processing chamber is completely replaced, and its composition becomes suitable for the (N+1)th step.

In addition, when set temperature of a wafer during processing is very different in the Nth step and an (N+1)th step, it requires time necessary for changing temperature of a sample stage on which the wafer is mounted and held, and there are cases where plasma is not produced so as not to make progress in processing of a film until change of the temperature is finished.

Meanwhile, even in a period when plasma is not produced between steps like this, there is a risk that particles causing dusts may be peeled off and break loose from a surface of an inner wall, attach to a wafer, and become dusts due to change in temperature of the inner wall of the processing chamber or the like. The above-described conventional technique did not fully take into consideration a problem of yields of wafer processing being lost due to dusts between processing steps when plasma is not produced for this reason.

An objective of the present invention is to provide a plasma processing apparatus or a plasma processing method by which yields of processing are improved.

In a plasma processing apparatus including a processing chamber, gas supply means for supplying process gas into the processing chamber; exhaust means for reducing pressure in the processing chamber, a high-frequency power supply for producing plasma, a stage electrode for getting a wafer mounted thereon, a power supply for fixing the wafer to the stage electrode by electrostatic chuck, and a high-frequency bias power supply for accelerating an ion entering the wafer, wafer potential is adjusted by changing voltage of electrostatic chuck between discharge steps according to a charged balance of occurring dusts.

The present invention is able to reduce the number of dusts attaching to a wafer by adjusting potential of the wafer according to a charged balance of dusts.

Other objects, features and advantages of the invention will become apparent from the following description of the embodiments of the invention taken in conjunction with the accompanying drawings.

BRIEF DESCRIPTION OF THE DRAWINGS

FIG. 3 is an image showing trajectories of particles that cause dusts and fly in directions in a processing chamber of the plasma processing apparatus;

FIG. 5 is a longitudinal sectional view schematically showing change in a state of an inner wall surface of a main part in the processing chamber involved in progress of wafer processing of the plasma processing apparatus according to the embodiment shown in FIG. 1;

FIG. 6 is a longitudinal sectional view schematically showing change in a state of the inner wall surface of the main part in the processing chamber involved in progress of wafer processing of the plasma processing apparatus according to the embodiment shown in FIG. 1;

FIG. 7 is a time chart showing a flow of operation of a plasma processing apparatus according to a variant example of the embodiment shown in FIG. 1;

FIG. 8 is a table describing correlations between processing conditions and an action on an inner wall of the processing chamber between steps of the variant example shown in FIG. 7;

FIG. 9 is a graph showing change in overall potential of a wafer adjusted according to increase in a cumulated time or cumulated number of wafers in processing in the plasma processing apparatus of the embodiment shown in FIG. 1; and FIG. 10 is a table describing change in detection results of the number of particles that have attached to a wafer relative to change in conditions between steps when etching was conducted using the wafer for dust inspection in the plasma processing apparatus according to the embodiment shown in FIG. 1.

DESCRIPTION OF THE EMBODIMENTS

Figure 1:
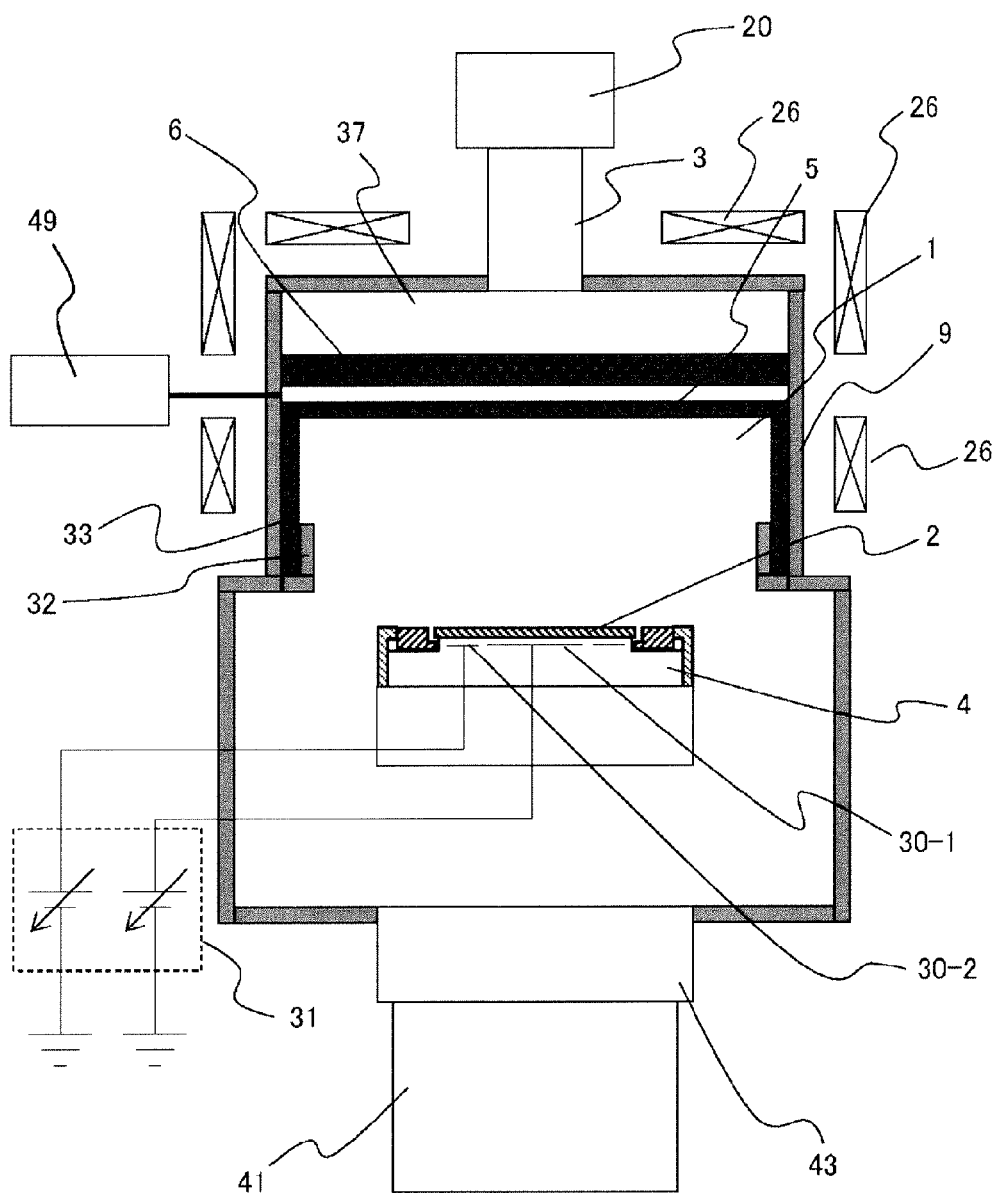
FIG. 1 is a longitudinal sectional view schematically showing outline of a configuration of a plasma processing apparatus according to an embodiment of the present invention.

Embodiments of the present invention will be explained below referring to the drawings.

Embodiment 1

An embodiment of the present invention will be explained below using FIGS. 1 to 5.

FIG. 1 is a longitudinal sectional view schematically showing outline of a configuration of a plasma processing apparatus according to an embodiment of the present invention. Especially, it shows a μ wave-ECR plasma etching apparatus as a plasma processing apparatus adopting the present invention.

In FIG. 1, the plasma processing apparatus broadly includes: a processing vessel including a vacuum chamber 9 and a processing chamber 1 having a cylindrical shape arranged inside the vacuum chamber 9; a plasma forming part arranged above the vacuum chamber and including a waveguide for propagating an electric field to form plasma and coils; and a an exhaust part arranged downward of the vacuum chamber and including an exhaust pump, such as a turbo-molecular pump, for exhausting gas in the processing chamber 1.

The processing chamber 1 is a space inside the vacuum chamber 9 and a room inside of which plasma is formed. Downward of the center of the processing chamber 1, there is arranged a stage electrode 4 on which a processing object substrate-like sample (hereinafter called a wafer 2) such as a semiconductor wafer is mounted. Above an upper surface of the circular stage electrode 4 on which the wafer 2 is mounted, there is arranged a shower plate 5 facing the stage electrode 4 and constituting a ceiling surface of the processing chamber 1, and a top plate 6 that is arranged with a gap above the shower plate 5 and a discoid member made of dielectric material such as quartz and that forms the vacuum chamber and is mounted on an upper end of a cylindrical vessel sidewall of a periphery of the processing chamber 1, with a seal member wedged between the top plate 6 and the upper end of the vessel sidewall to section the inside from the outside of the processing chamber 1 in an airtight manner.

In a space upper than the upper surface of the stage electrode 4 or the wafer 2 in the processing chamber 1, i.e. a space for forming plasma, an inner cylinder 33 made of quartz is arranged surrounding the space and inside the vacuum chamber 9. In other words, a cylindrical outer circumference wall surface of the inner cylinder 33 is arranged with a gap covering the space for plasma formation by an inside of an inner circumference surface of a cylindrical sidewall member of the vacuum chamber, and an inner circumference wall surface of the inner cylinder 33 is arranged surrounding the space for plasma formation and faces plasma.

Furthermore, downward of the inner cylinder 33, an earth 32 is installed that is a ring member electrically connected with an unshown earth electrode and is made at earth potential. An upper part of the earth 32 is a member constituting the inner wall of the processing chamber 1 and arranged surrounding the processing chamber 1 above the stage electrode 4, and is arranged covering an inner circumference surface at a lower part of the inner cylinder 33 and contacts with plasma. A member constituting the earth 32 has a structure of yttria being coated on a surface of metal such as aluminum.

In a prescribed range at a central part of the shower plate 5, a plurality of through-holes letting gas to be supplied into the processing chamber 1 flow through therein are arranged. Gas supplied by process gas supply means 49 and introduced in the gap between the shower plate 5 and the top plate 6 goes through the through-holes and flows into the processing chamber 1 from above the stage electrode 4. On the other hand, at a lower part of the processing chamber 1 and direct downward of the stage electrode 4, an exhaust port is provided that discharges gas supplied into the processing chamber 1, plasma formed inside, particles generated by reaction and the like to the outside of the processing chamber 1.

The exhaust port is arranged being coupled with an entrance of a turbo-molecular pump 41 arranged downward of the vacuum chamber 9 with a pressure regulation valve 43 in between. The pressure regulation valve 43 includes a plurality of plate-like flaps (not shown) that are arranged in a direction coming across an exhaust channel communicating between the entrance of the turbo-molecular pump 41 and the exhaust port and rotate around their shafts, and increases or decreases a channel cross-section area of the exhaust channel according to a rotation angle of the flaps. In the embodiment, by exhaust operation of the turbo-molecular pump 41 and adjustment of a rotation angle position of the pressure regulation valve 43, the amount and speed of exhaust from the inside of the processing chamber 1 are adjusted.

The stage electrode 4 is equipped therein with a discoid metallic electrode that is supplied with power from an unshown high-frequency power supply. Above the electrode, there is arranged an electrostatic chuck equipped with a dielectric film, and an inside circular electrode 30-1 and an outer circumference side ring electrode 30-2 (outside) that are arranged inside the dielectric film and supplied with direct current to attract and hold a wafer 2 on the dielectric film by static electricity. The two electrodes 30-1, 30-2 are made such that their occupying areas on a mounting surface of the dielectric film viewed from their upward are the same or values approximate to a degree regarded as the same, and each of them is electrically connected with a different power supply 31 for electrostatic chuck.

Above the top plate 6, there is arranged, as the plasma formation part, a cylindrical waveguide 3 in which an electric field supplied to form plasma in a space above the stage electrode 4 in the processing chamber 1 is formed and propagated, and a hollow resonance part 37 that is a cylindrical vessel arranged between a lower end part of the waveguide 3 and the top plate 6 and that is coupled with a lower end of the waveguide 3. A microwave power supply 20 is arranged at an upward end of the waveguide 3, and the electric field to form plasma is formed by oscillation of the microwave power supply 20. In addition, coils 36 to form a magnetic field are arranged at positions of a cylindrical sidewall surrounding a circumference of the processing chamber 1 in the vacuum chamber 9, an outer circumference of the hollow resonance part 37, and above the hollow resonance part 37 and surrounding the outer circumference of the waveguide 3.

The wafer 2 before processing and mounted on a tip of an arm of a transfer robot arranged in a transfer room inside an unshown transfer vessel coupled with a sidewall downward of the cylindrical part of the vacuum chamber 1 is held above the mounting surface composed of the dielectric film on the stage electrode 4 in the processing chamber 1 after it is transferred there in a state of being on the arm and held by it by the arm of the transfer robot extending in a state of a gate valve being open, the gate valve opening or closing communication between the transfer room and the processing chamber 1. Then, the gate valve is closed, the inside of the processing chamber 1 is sealed, and the wafer 2 is passed to the stage electrode 4 and mounted on the mounting surface.

Power from the power supply 31 is supplied to the electrodes 30-1, 30-2, electrostatic force formed by electric charge accumulated between the dielectric film and the wafer 2 works on, and the wafer 2 is attracted to the dielectric film 2 and held. In this state, process gas from the process gas supply means 49 is introduced into the processing chamber 1 through the through-holes of the shower plate 5, and the inside of the processing chamber 1 is adjusted to a value of pressure in a range suitable for processing by a balance of the amount and speed of supply of the process gas, and the amount and speed of exhaust through the exhaust port by the exhaust pump such as a turbo-molecular pump.

A microwave electric field formed by the microwave power supply 20 propagates through the waveguide 3, goes into the processing chamber hollow resonance part 37, inside it a prescribed electric field mode is amplified, and in that state, the electric field is introduced into the processing chamber 1 via the top plate 6 and shower plate 5. By interaction of the microwave electric field supplied into the processing chamber 1 by passing through the top plate 6 and shower plate 5 and the magnetic field formed by the coils 36 and supplied into the processing chamber 1, the process gas in the processing chamber 1 is excited and plasma is formed, and high-frequency power is supplied to the electrodes inside the stage electrode 4, which starts etching of a processing object film of a film structure made by laminating a plurality of layers of films including a mask layer arranged beforehand on a surface of the wafer 2.

Then, when an unshown end point determining device detects an end point of etching, supply of the high-frequency power is stopped, and furthermore supply of the electric field and magnetic field is stopped to stop formation (discharge) of plasma. If etching includes a plurality of steps, after end of processing of any step, preset values such as a composition of the process gas, a flow rate and temperature of the stage electrode 4, pressure in the processing chamber 1, and a value of high-frequency power are achieved in tune with processing conditions of the next step, and once again an electric field and a magnetic field are supplied, plasma is formed, high-frequency power is supplied, and processing of the next step is started.

When the plurality of predetermined steps are detected to be finished, after the electric charge achieving electrostatic chuck is removed, the wafer 2 is lifted above the mounting surface of the dielectric film of the stage electrode 4, the wafer 2 is passed to the arm of the transfer robot entering the processing chamber 1 by extending from the transfer room communicated with the gate valve that is opened, and the wafer 2 is carried out of the processing chamber 1 by retraction of the arm. Then, when there is another unprocessed wafer 2 in the transfer room, the wafer 2 is again transferred into the processing chamber 1, mounted on the stage electrode 4, and processing is conducted. If there is no unprocessed wafer 2, the gate valve is closed, and processing of a series of multiple wafers 2 is finished.

In the conventional technique, there has arisen a problem in which in a period when plasma is not produced (discharge is stopped) between different steps in the above-described processing (hereinafter called an inter-step referring to a period between an end of a previous step and a start of the next step of two processing steps and discharge is stopped unless there is particular reference), particles breaking loose and staying in the processing chamber 1 attach to the wafer in the processing chamber 1, making dusts occur. As a result of study by the present inventors, it has become clear that particles causing dusts in an inter-step include three types of particles: positively-charged particles, negatively-charged particles, and uncharged particles. Furthermore, it has become clear that a balance of the numbers of particles which are respectively charged, i.e. a proportion of the number of positively-charged particles, the number of negatively-charged particles, and the number of uncharged particles is influenced by a plurality of factors including quality of material of dust particles, quality of material of an inner wall surface of the processing chamber, and potential of the inner wall of the processing chamber.

Furthermore, it has also become clear that change in a state of the inner wall of the processing chamber by etching changes a place where particles causing dusts occur from the inner wall surface and their elements, and along with the change, the charged balance of the particles changes. In addition, the inventors obtained knowledge that because there are cases where there is a large deviation in the charged balance, i.e. in the case where the number of positively-charged particles is larger than the number of negatively-charged particles by a ratio of a predetermined value or more, or the other way round, the number of negatively-charged dusts is larger than the number of positively-charged dusts by a ratio of a predetermined value or more, or furthermore difference between the quantity of positively-charged dusts and the quantity of negatively-charged dusts is small within a prescribed value, there are cases where it is effective and where it is adversely effective to adjust potential distribution in the processing chamber by changing potential of the wafer and thereby to perform transfer control of the dusts by electrostatic force.

This led the inventors to obtain knowledge that it is necessary to appropriately control electrostatic force formed on the surface of the stage electrode according to the state of the inner wall of the processing chamber in order to reduce the number of dusts attaching to the wafer during the inter-step and to come up with the present invention.

Figure 2:
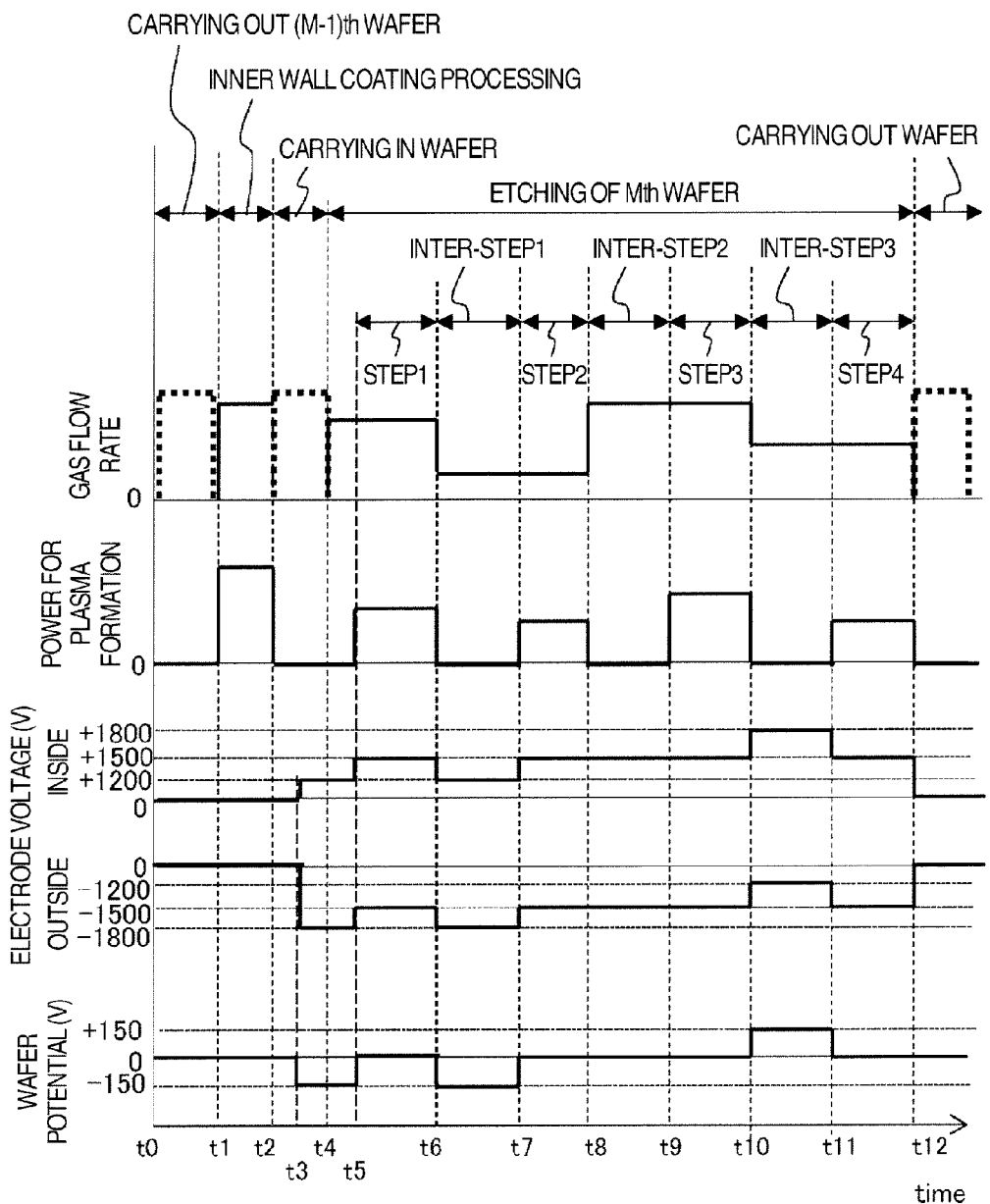
FIG. 2 is a time chart showing a flow of operation of the plasma processing apparatus according to the embodiment shown in FIG. 1.

Next, a flow of operation according to which the plasma processing apparatus of the embodiment processes the wafer 2 will be explained using FIG. 2. FIG. 2 is a time chart showing a flow of operation of the plasma processing apparatus according to the embodiment shown in FIG. 1. In particular, it shows multiple operations along passage of time when an Mth, which is any number, wafer 2 is processed.

First, in the plasma processing apparatus of the embodiment, in a state of the wafer 2 being not mounted on the dielectric film constituting the upper surface of the stage electrode 4 during a period between time t0 when an (M−1)th wafer 2 was carried out from the processing chamber 1 and time t2 when a next Mth wafer 2 is carried in, process gas including Si (for example, gas including $SiCl_4$) is supplied into the processing chamber 1, and by using plasma produced using the process gas, a process of inner wall coating processing is conducted to attach a film composed of a substance including Si, such as SiOx or SiOxNy, to the inner wall of the processing chamber 1. In other words, at time t0 when carrying out the (M−1)th wafer is finished, rare gas such as Ar is introduced in the processing chamber 1, and after that, at time t1, along with gas for coating processing including $SiCl_4$ being introduced in the processing chamber 1, an electric field and a magnetic field are supplied, and plasma is formed.

Interaction between the plasma and the inner wall surface of the processing chamber 1 forms a film including Si on the inner wall surface. In the case of consecutively processing a plurality of wafers 2 by execution of this process, the inner wall of the processing chamber 1 is made in a prescribed state or a state of a condition approximate to a degree regarded as the prescribed state at a start time of processing of each wafer 2.

Furthermore, in the process of inner wall coating processing, plasma is formed to attach a new coating film for processing the Mth wafer 2 after cleaning discharge is first performed by forming plasma to remove residual of a coating layer formed before processing the (M−1)th wafer. Such a processing process is called ISCC (In-Situ Cleaning and Coating).

Next, after inner wall coating processing is finished, at time t2 the Mth wafer 2 is carried into the processing chamber 1, mounted on the stage electrode 4, and attracted and held, and then the Mth wafer 2 undergoes etching of a processing object film of a film structure formed beforehand on a surface of the Mth wafer 2 (time t4-t12). In the embodiment of FIG. 2, processing conditions (recipes) of the etching broadly includes four discharge steps (step 1 to step 4), and during each of periods between steps (inter-step 1 to inter-step 3), discharge is halted (i.e. discharge power is made zero).

Voltage for electrostatic chuck is made such that absolute values of voltage of the outside and inside in each processing step are the same but their polarities are opposite (+1500 V at the inside and −1500 V at the outside), but in the inter-step 1 (time t6-t7) between the processing step 1 (time t5-t6) and the step 2 (t7-t8), respective voltage values are decreased, and the inside voltage is made +1200 V and the outside voltage is made −1800 V. This makes potential of the wafer 2 (in the embodiment, regarded as (inside voltage+outside voltage)/2) negative potential of −300 V.

Next, in the inter-step 2 (t8-t9) between the processing step 2 and the step 3 (t9-t10), absolute values of voltage of the outside and inside are the same but their polarities are opposite (+1500 V at the inside and −1500 V at the outside). The potential of the wafer 2 is zero at this time.

Then, in the inter-step 3 (t10-t11) between the processing step 3 and the step 4 (t11-t12), voltage of both inside electrode 30-1 and outside electrode 30-2 is shifted to a positive side of 300 V, and the voltage value of the electrode 30-1 is made +1800 V and the voltage value of the electrode 30-2 is made −1200 V. This makes the potential of the wafer 2 (positive potential of) +300 V.

Furthermore, during a period (time t3-t5) between time when the wafer 2 is carried into the processing chamber 1 and mounted on the stage electrode 4 and time when etching by plasma formation in the processing step 1 is started, also the voltage value of the electrode 30-1 is made +1200 V and the voltage value of the electrode 30-2 is made −1800 V, and this situation is kept until etching start time t5. This keeps the potential of the wafer 2 negative (−300 V) during a period between time t3 when the wafer 2 is mounted on the stage electrode 4, power for electrostatic chuck is applied to the electrodes 30-1, 30-2, and the wafer 2 is attracted and held and time t5 when plasma is formed and processing is started.

In addition, the flow rate of gas during the inter-step 1 is reduced and matched to a flow rate of process gas in the step 2 reduced from the processing step 1. In addition, power for plasma formation in the processing step 2 is relatively reduced from the step 1. On the other hand, in the processing step 3, the flow rate of process gas is made larger than that in the step 1, and power for plasma formation is made larger too. In the processing step 4, the flow rate of process gas is made a value between values in the step 1 and step 2, and the power for plasma formation is made nearly the same as that in the step 2.

When the processing step 4 from time t11 to t12 is finished, at time t12 supply of the process gas is stopped, rare gas is supplied into the processing chamber 1 instead, and carrying the Mth wafer 2 out of the processing chamber 1 is started. If there is another processing object wafer 2, the process returns to the start of the inner wall coating processing at time t1, in the same manner as the case of the Mth wafer 2, values of power for electrostatic chuck, types of gas, its composition, flow rate speed supplied at each step and inter-step of etching along passage of time from time t2 to t12 are adjusted, and etching of the (M+1)th wafer 2 is conducted.

In the embodiment, progress of steps of such processing and adjustment of values of voltage applied to the electrodes 30 for the electrostatic chuck during inter-steps involved in the progress are conducted according to a command signal from an unshown control device.

Next, there will be described a reason for, like this, adjusting the potential of the wafer 2 by changing voltage of the electrodes of the electrostatic chuck or overall potential of the wafer while plasma formation is stopped between a plurality of steps. The inventors measured in an experiment trajectories of particles that fly in the processing chamber inside the vacuum chamber reduced in pressure of the plasma processing apparatus and that cause dusts. FIG. 3 is an image showing trajectories of particles that cause dusts and fly in directions in a processing chamber of the plasma processing apparatus. The plasma processing apparatus used in the experiment is similar to one in a document (H. Kobayashi Japan. J. Appl. Phys. 50 (2011) 08JE01).

In the measurement, test particles were scattered from a left-hand direction to a right-hand direction on the figure in the processing chamber in a state of being vacuum in the processing chamber. Trajectories of dust particles were detected as lines or aggregations of consecutive points by measuring, with a CCD camera, scattered light produced by scattering test particles in the state of laser light being radiated from a prescribed direction in the processing chamber and by making the dust particles come across the laser light. Additionally, because a laser is driven by pulses, a trajectory of a fast dust is measured as an aggregation of points and a trajectory of a slow dust as a line.

As shown in FIG. 3(b), the apparatus used in the experiment is equipped with an electrode to apply direct current (DC) power directly above a position corresponding to an upper end of the image shown in FIG. 3(a), and an electric field in a vertical direction can be generated in the vicinity of a region to be detected. In the experiment shown in the figure, −500 V was applied to the upper electrode and an upward electric field was generated.

In the case of an uncharged particle, when its speed is fast, its trajectory is close to a straight line, and when its speed is slow, its trajectory is a symmetrical parabola protruding upward. In addition, in the case of charged particles, a particle whose speed is fast or diameter is large (heavy in mass) draws a trajectory close to a straight line.

On the other hand, a trajectory of a particle shown in "a" in FIG. 3(a) protrudes downward, it is recognized that this particle is attracted upward. This indicates the particle is charged positively.

In addition, a trajectory shown as "b" goes downward as it goes toward a right-hand side, but because the trajectory is not a symmetrical parabola, it is recognized this particle is repelled downward. This indicates the particle is charged negatively.

In the same manner as the experiment in FIG. 3, also when +500 V was applied to the upper electrode, both trajectory of a particle attracted upward and trajectory of a particle repelled downward can be detected. The inventors compared results of trajectory calculation obtained by simulation and results of detection shown in FIG. 3, and confirmed that there are many uncharged dusts as a study result. It has become clear from this that in particles flying in directions in the processing chamber 1 in the state of plasma being not formed, three types of dust particles are mixed: positively-charged dust particles, negatively-charged dust particles, and uncharged dust particles.

In addition, the present inventors examined how the number of dusts dropping on the wafer changes depending on the potential of the wafer or ESC voltage by changing material of the inner wall, elements of occurring dusts or changing a place where dust particles occur. As a result it has become clear that there are three patterns as shown in FIG. 4.

Figure 4:
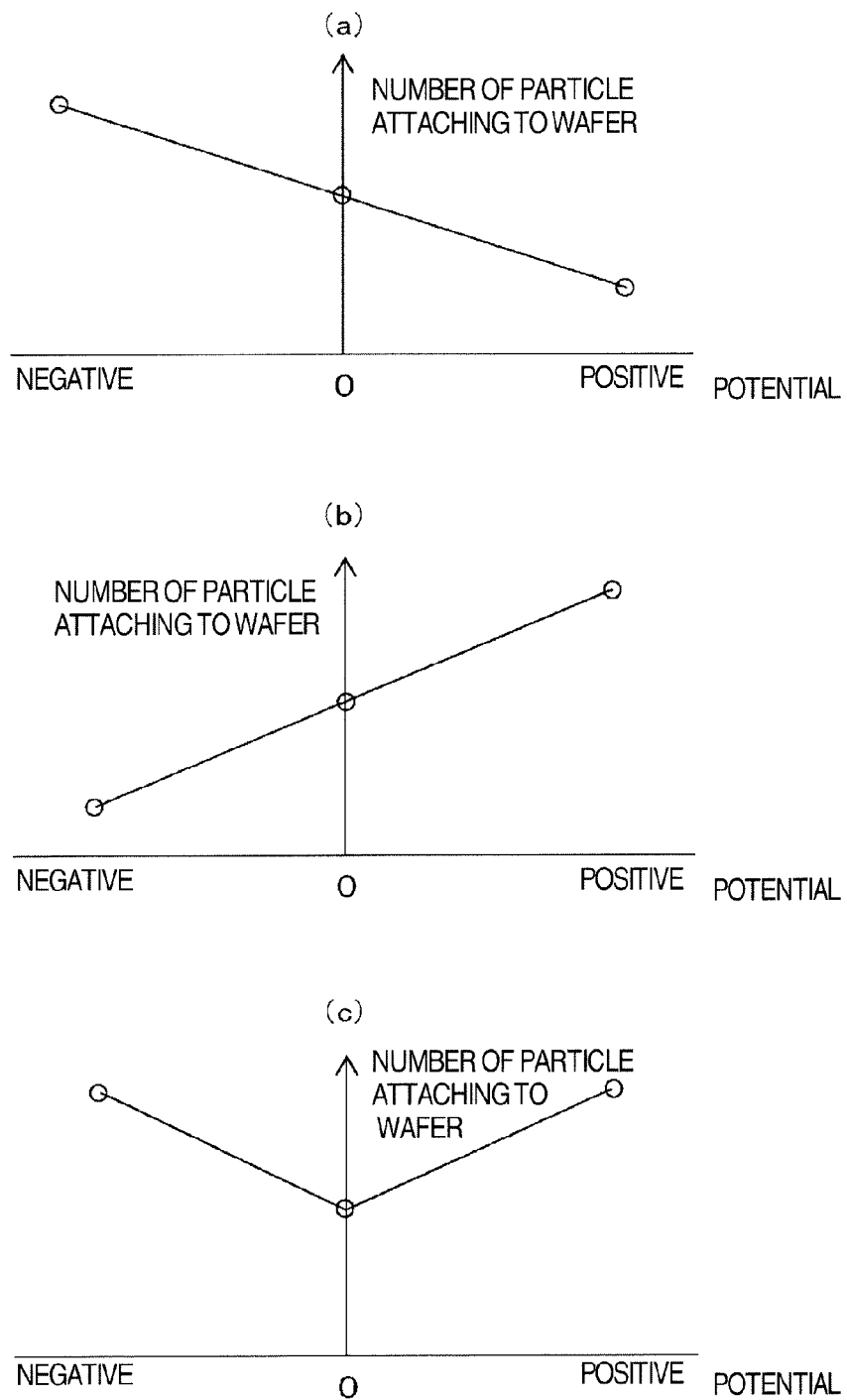
FIG. 4 is a graph schematically showing relation between a ratio per polarity in which particles in the processing chamber are charged and the number of particles attaching to a wafer in the plasma processing apparatus according to the embodiment shown in FIG. 1.

FIG. 4 is a graph schematically showing relation between a ratio per polarity in which particles in the processing chamber are charged and the number of particles attaching to a wafer in the plasma processing apparatus according to the embodiment shown in FIG. 1. FIG. 4 (a) shows an example in which when the potential of the wafer 2 is made positive, the number of dusts dropping on and attaching to the wafer 2 decreases. This is considered to show a case where the positively-charged dusts are significantly more than the dusts charged to a negative value.

On the other hand, FIG. 4(b) shows an embodiment in which when the potential of the wafer 2 is made negative, the number of dusts dropping on the wafer 2 decreases, and this is considered to show a case where the negatively-charged dusts are significantly more than the positively-charged dusts. FIG. 4(c) shows an embodiment in which when the potential of the wafer 2 is made zero, the number of dusts dropping on the wafer 2 is minimum, and this shows a case where difference between the quantity of positively-charged dusts and the quantity of negatively-charged dusts is small.

Furthermore, the present inventors paid attention to the fact that three types of particles which are divided into positive, negative and neutral in their charged states are mixed in the processing chamber 1, and studied, by performing transfer simulation of particles, how the number of dusts dropping on the wafer 2 changes depending on the potential of the wafer 2 relative to change in a charged probability when dusts are peeled off from the inner wall surface of the processing chamber 1 and when they reflect at the inner wall surface. As a result, for example, assuming that a probability of being charged positively is 50%, a probability of being charged negatively is 25%, and the number of positively-charged dusts significantly larger than the number of negatively-charged dusts, it has become clear that it shows a similar trend to FIG. 4(a). In other words, it has become clear that when the potential of the wafer 2 is made a positive value, negatively-charged dusts are attracted, but more abundant positively-charged dusts are proactively prevented from coming close to the surface of the wafer 2, and as a whole, the number of dusts attaching to the wafer 2 can be reduced.

Conversely, in the case where the number of negatively-charged dusts significantly larger than the number of positively-charged dusts, such as a probability of being charged negatively is 50%, a probability of being charged positively is 25%, it has become a similar trend to FIG. 4(b). In other words, making the potential of the wafer 2 a negative value attracts positively-charged dusts, but prevents more abundant negatively-charged dusts from coming close to the wafer, and can reduce the number of dusts attaching to the wafer 2 as a whole.

In addition, in the case where the number of positively-charged dusts and the number of negatively-charged dusts are equivalent or their difference is certain difference or less, such as a probability of being charged positively is 40%, and a probability of being charged negatively is also 40%, it has become clear that it is a similar result to FIG. 4(c). In other words, it has become clear that in this case, by disabling electrostatic force from working, the number of dusts attaching to the wafer 2 can be reduced.

Next, there will be described which of three types of states each particle causing a dust will be charged to, and a factor that determines a balance among the numbers of particles charged to the respective three types of states. The inventors found out as a result of study that it is determined by at least quality of material of dusts and the wall surface, and potential of the wall surface. In an apparatus having the configuration shown in the FIG. 1, because it is considered that dusts occurring from the shower plate 5 tend to be charged negatively, and dusts occurring from the earth 32 tend to be charged positively, it has become clear that there are cases where dependency of the number of dusts attaching to the wafer 2 on the potential of the wafer 2 can be explained appropriately. A physical reason for this can be considered as follows.

In the apparatus using plasma by ECR with an effective magnetic field shown in FIG. 1, it must be considered that movement of ions and electrons staying in the processing chamber 1 when plasma is distinguished has caused ambipolar diffusion in the effective magnetic field. In other words, at an inner wall surface vertical to the magnetic field, flux of the electrons tends to be relatively larger than that of the ions, and the inner wall surface has a strong tendency of being relatively negative potential. Conversely, at an inner wall surface parallel to the magnetic field, flux of the ions becomes relatively more than that of the electrons, and the inner wall surface has a strong tendency of being relatively positive potential.

Lines of magnetic force of magnetic fields formed by the coils 36 arranged around circumferences of an upper side and a lateral side of the cylindrical processing chamber 1 as shown FIG. 1 intersect with the shower plate 5 constituting the ceiling surface of the processing chamber 1 at an angle relatively close to vertical compared with the inner wall surface of the cylindrical processing chamber 1. This leads to understanding that the shower plate 5 tends to be relatively negative potential to the sidewall surface or the earth 32 arranged at the center side of the processing chamber 1 relative to the sidewall surface and covering the sidewall surface, and particles breaking loose or peeled off from the shower plate 5 tend to be charged negatively.

On the other hand, at the earth 32 which the lines of magnetic force run parallel to or intersect with a slant with an angle close to parallel, the earth 32 tends to be relatively positive potential compared with the shower plate 5, and it is considered that the number of positively-charged particles breaking loose or peeled off from the earth 32 is relatively large.

Next, magnitude of voltage values of the electrodes 30-1, 30-2 for electrostatic chuck in inter-steps shown in FIG. 2 will be explained using FIGS. 5 and 6. FIGS. 5 and 6 are longitudinal sectional views schematically showing change in a state of an inner wall surface of a main part in the processing chamber involved in progress of wafer processing of the plasma processing apparatus according to the embodiment shown in FIG. 1.

Execution of inner wall coating processing forms a coating made of material including Si on the inner wall surface of the processing chamber 1, especially inner surfaces of the shower plate 5, inner cylinder 33 and earth 32 facing plasma (FIG. 5(*a*)). On one hand, during processing of the step 1 conducted next, on the surface of the earth 32 worn heavily by incidence of ions which are charged particles having positive potential, a coating layer 83 made of a substance including Si formed in inner wall coating processing before starting processing becomes thin, whereas thick coating is remained on the shower plate and inner cylinder.

Therefore, in the inter-step 1 between the step 1 and step 2, it is considered that particles of a substance including Si peeled off from the coating layer 83 of the shower plate 5 and inner cylinder 33 account for a main ratio of particles flying above the stage electrode 4 in the processing chamber 1 (FIG. 5(*b*)). Because the coating layer 83 is slightly conductive, it is assumed that potential of the coating layer covering the upper part and ceiling surface of the processing chamber 1 is negative potential as a whole drawn by potential of the shower plate 5.

It is considered from this that particles of a substance including Si floating in the processing chamber 1 have a negatively-charged ratio larger than a positively-charged ratio. In this case, dependency of the number of dusts attaching to the wafer 2 on the potential of the wafer 2 is as shown in FIG. 4(*b*). Thus, the embodiment is configured such that overall potential of the wafer 2 will be negative during the inter-step 1.

Next, in plasma processing in the step 2, the coating layer 83 of the earth 32 is further pruned away by interaction with plasma, and there is a risk that the coating layer 83 will be completely removed depending on a condition, and which causes a place where a surface of a member of the earth 32 is exposed. In such a case, it is considered that as shown in FIG. 6(*a*), particles peeled off and floating from the surface of the member of the earth 32 in the inter-step 2 between the step 2 and step 3 are a significant mix of both particles including yttria ($Y_2O_3$) constituting the coating of the surface of the earth 32 and particles of a substance including Si peeled off from the coating layer 83 covering shower plate 5.

As described above, particles of a substance including yttria peeled off from the positively-charged surface of the earth 32 in the state of plasma being not formed tend to be charged positively, whereas particles of a substance including Si peeled off from the upper part or ceiling surface of the processing chamber 1 tend to be charged negatively. Therefore, in the inter-step 2, difference between the quantities of positively and negatively-charged particles tends to be smaller than in the inter-step 1.

A tendency of dependence of the number of dusts attaching to the wafer 2 on the potential of the wafer 2 in this case is such that shown in FIG. 4(*c*). From this, in the embodiment, in the inter-step 2 when the number of relatively positively-charged particles from the surface of the earth 32 increases, it is desirable that the overall potential of the wafer 2 is made zero or a value close to zero and electrostatic force does not work on charged dusts.

In the next processing step 3, wear of the coating layer 83 formed on the surfaces of the shower plate 5 and inner cylinder 33 further progresses and its thickness becomes thin in a large area, and according to a condition, the coating layer 83 is completely removed in part of its area, an area exposed to plasma of a surface of an initially-covered lower member becomes large. In the inter-step 3 which is a period after being made such a state, as shown in FIG. 6(*b*), it is assumed that the number of particles including yttria constituting the coating on the surface of the earth 32 dominates among particles occurring from the surface of the earth 32, and the number of positively-charged particles becomes relatively large among particles floating in the processing chamber 1.

In this case, a tendency of dependence of the number of dusts attaching to the wafer 2 on the potential of the wafer 2 is such as shown in FIG. 4(*a*). From this, in the embodiment, in the inter-step 3 of a period after that, by making the overall potential of the wafer 2 positive, positively-charged particles are prevented from attaching to the wafer.

In the embodiment as described above, the potential of the wafer 2 in each of the inter-steps 1 to 3 is adjusted to an optimal value capable of restraining attachment of particles causing dusts in response to change in places where particles occur or a balance of polarities of charged particles due to change in thickness of the coating layer 83 of the inner wall along with progress of processing steps. It is also effective to adjust the potential of the wafer 2 in restraining dusts not only in the inter-steps 1 to 3 but also in a period (time t2-t5) between after carrying in the wafer 2 and start of forming plasma.

In FIG. 2, the potential of the wafer 2 is adjusted to a negative value because places where particles break loose and the like are similar to the inter-step 1. This is because as shown in FIG. 5(*a*), in particles floating in the processing chamber 1 in such a period, particles of a substance including Si occurring from the upper part and ceiling surface of the processing chamber 1 are dominant in the processing chamber 1.

Next, a variant example of the embodiment will be explained using FIGS. 7 and 8. FIG. 7 is a time chart showing a flow of operation of a plasma processing apparatus according to a variant example of the embodiment shown in FIG. 1. The variant example shows a flow of operation of etching conducted in the plasma processing apparatus shown in FIG. 1, and its difference from the embodiment of the flow of operation shown in FIG. 2 lies in whether there is inner wall coating processing or not.

In the plasma processing apparatus shown in FIG. 1, if main material of a member constituting the inner wall surface of the processing chamber 1 is yttria, a main component of particles causing dusts is often yttria. The reason is that a semiconductor device is mainly made of Si-based material such as Si or $SiO_2$, and quartz on the inner wall surface is worn more severely compared with yttria when such material is processed by etching.

In other words, even if particles that will be a source of Si-based particles caused by a member made of quartz constituting the inner wall or byproduct particles are attached to the inner wall, they are pruned when material of the upper surface of the wafer 2 undergoes etching and eventually disappear. On the other hand, because yttria has a relatively high resistance property to plasma, when particles of a substance including yttria are attached to the inner wall surface, they are hardly worn during a processing step of plasma being formed and stay on the inner wall surface for a long period.

Then, part of deposit about which particles that had stayed have accumulated is peeled off from the inner wall by interaction with plasma and some particles float in the processing chamber 1, and part of the particles attach to the wafer 2, thereby contaminating it. It is considered like this that as particles attaching to the wafer 2, particles including yttria as an element increase.

In addition, when yttria is used as material of a member constituting the earth 32, part of bias power applied to the wafer 2 is also applied to the earth 32 side, thereby a surface of yttria is pruned, and yttrium (Y) atoms and active particles (radicals) including Y such as YxOy or YxFy (when process gas including F is used) are discharged. Part of the atoms and radicals are destined to attach the inner wall surface of the processing chamber 1 such as the quartz inner cylinder 33 and the quartz shower plate 5.

If speed of attachment and accumulation of such Y atoms and Y-based radicals is slow, quartz is worn by interaction with plasma and particles of Y atoms and Y-based radicals are also removed from the inner wall surface, causing little possibility of becoming a thick deposit film. On the other hand, if deposition proceeds at certain speed or more, a Y-based deposit film is formed there, and this may be an occurrence source of Y-based dusts.

In a process of etching that comprises a plurality of steps and stops formation of plasma (stops discharge) between steps in such a state in which particles of a substance including Y are peeled off from the surface of the shower plate 5 and even the surface of the earth 32, explanation will be given about an embodiment of appropriately adjusting a value of voltage supplied to the electrode 30 for electrostatic chuck. In the embodiment, a film structure of a plurality of films laminated and formed beforehand on the surface of the wafer 2 comprises a reflection prevention film composed of a resist made of resin, a film of a substance including carbon, a $S_iO_2$ film, and an underlying film from upward in the described order.

In FIG. 7, step 1 conducted in time t5-t6 is a step of etching the reflection prevention film of a resist, step 2 is a step of etching the carbon-based film, step 3 is a step of etching the $SiO_2$ film, and step 4 is a step of ashing the resist. As process gas of each step, the step 1 uses gas including CF as a composition, the step 2 uses gas including $O_2$ and $N_2$, the step 3 uses CF, and the step 4 uses process gas including $O_2$, $N_2$, $H_2$ or the like as main compositions.

Among these processing steps, in the step 1 and step 3 using CF-based process gas, the inner cylinder 33 and shower plate 5 made of quartz are relatively severely worn. Therefore, deposit including Y attaching to the surfaces of these members as material is easy to be peeled off.

In addition, when attention is paid to high-frequency power for bias potential formation supplied to the stage electrode 4, the high-frequency power is large in the step 2 and step 3, and wear of the earth 32 is large in these steps; therefore, it can be said particles of a substance including Y are easy to be peeled off from the earth 32.

The above-described characteristics are summarized in FIG. 8. FIG. 8 is a table showing correlations between processing conditions and an action on the inner wall of the processing chamber in the inter-steps of the variant example shown in FIG. 6.

As shown in the figure, interaction with plasma occurring on the inner wall surface of the processing chamber 1 in the embodiment, simply stated, changes its characteristics according to types of process gas and the magnitude of power for bias formation, and distribution of places where particles occur changes. Along with such a change, a balance of polarities in which particles are charged changes.

In other words, in the step 1, process gas including F as a composition is used, wear of quartz constituting the member of the inner wall is relatively large, whereas power for bias formation supplied to the stage electrode 4 is relatively small, and therefore wear of the earth is small. Therefore, particles floating in the processing chamber 1 include, as a main element, particles of a substance including Y peeled off from the surface of the member constituting the quartz inner wall.

When the number of particles peeled off from the shower plate 5 becomes dominant, the number of negatively-charged particles becomes larger than the number of positively-charged particles. Therefore, in the same manner as the embodiment in FIG. 2 in the variant example, by changing the value of voltage applied to the electrodes 30-1, 30-2 to a negative side (1200 V and −1800 V), the overall potential of the wafer 2 is made a negative value during the inter-step 1 after the processing step 1. This restrains particles charged negative potential from attaching to the wafer 2.

The reason why the quartz shower plate 5 rather than the quartz inner cylinder 33 is regarded as a main place where particles including Y break loose is that in the plasma processing apparatus shown in FIG. 1, an ECR surface often comes across the cylindrical inner surface of the inner cylinder 33, in this case the inner surface of the inner cylinder 33 is exposed to strong plasma; therefore speed of wear is faster than that of the shower plate 5. This makes particles including Y easy to accumulate and grow on the surface of the shower plate 5 than the surface of the inner cylinder 33, and it is considered that particles including Y floating in the processing chamber 1 mainly come from the surface of the shower plate 5.

Next, the inter-step 2 will be explained. Because in the step 2 which is previous processing, process gas not including F is used, wear of the surface of the quartz member constituting the inner wall is relatively small, in the inter-step 2 after end of the step 2, occurrence of dusts caused by particles of a substance including Y from the surface of such a member is small. On the other hand, because power for bias formation supplied to the stage electrode 4 is large, wear of the quartz earth 32 is relatively large.

Therefore, in the inter-step 2, a ratio of particles of a substance including Y peeled off from the surface of the earth 32 increases in particles floating in the processing chamber 1. About such particles, because a ratio of positively-charged particles becomes significantly larger than a ratio of negatively-charged particles, the overall potential of the wafer 2 is made positive in the inter-step 2.

More particularly, in the same manner as the embodiment in FIG. 2 in the variant example, both values of voltage applied to the electrodes 30-1, 30-2 are changed to a positive side (1800 V and −1200 V). This restrains particles charged positive potential from attaching to the wafer 2.

Next, the inter-step 3 will be explained. Because in the step 3 which is previous processing, process gas including F is used, wear of the quartz member constituting the inner wall is relatively large, and in the inter-step 3 after the step 3, deposit formed of a substance including Y from the surface of such a member is in a state of more easily being peeled off. Particles peeled off or breaking loose from the surface of such a member are often charged positively.

On the other hand, because power for bias formation is made relatively large, wear of the earth 32 is large, and particles of a substance including Y peeled off and breaking loose from the surface of the earth 32 increase. About such particles, a positively-charged ratio is significantly larger than a ratio of negatively-charged dusts. As a result, in the inter-step 3, difference between the numbers of negatively-charged particles and positively-charged particles becomes small among particles floating in the processing chamber 1.

Therefore, in the variant example, in the inter-step 3, the overall potential of the wafer 2 is made 0 or a value approximate to 0. In particular, in the inter-step 3, voltage of direct current power supplied to the electrodes 30-1, 30-2 are made +1500 V and −1500V, respectively. This restrains particles floating in the processing chamber 1 from attaching to the wafer 2.

In other words, in the variant example, in the step 3 which is processing before the inter-step 3, the overall potential of the wafer 2 is adjusted such that the amount of attachment of particles can be reduced in the inter-step 3 after that, according to a condition that at which part of the member of the inner wall of the processing chamber 1 the amount of ware is large (what kind of process gas is used for processing, how large bias power is applied, etc.).

As described above, in the case where a film of a substance including yttria on the inner wall surface of the earth 32 is arranged, when a substance including Y (yttrium) as a composition is attached to a surface of another member made of quartz in the processing chamber 1, particles made of a substance including Y and causing dusts be peeled off or float from such a surface of the member constituting the inner wall surface of the processing chamber 1.

However, after conducting a process of removing a substance attached to or accumulated on the inner wall surface of processing chamber 1 such as WET cleaning, a place where particles formed of a substance including Y start to be peeled off or float can be made only the earth 32. As a result of attachment and accumulation of a substance including Y onto the surface of the member constituting the inner walls of the quartz shower plate 5, quartz inner cylinder 33 and the like, together with increase in cumulated time of processing the wafer 2 (increase in the number of processed wafers 2), particles and flakes of the substance are peeled off from these surfaces and float in the processing chamber 1.

Because of this, regarding particles floating in the processing chamber 1, a ratio of positively-charged dusts is relatively large right after the process of cleaning the inner wall of the processing chamber 1 such as WET cleaning, whereas a ratio of negatively-charged particles increases along with elapse of the time from the end of the cleaning process. In response to such a phenomenon, the number of particles attaching to the wafer 2 in the processing chamber 1 can be restrained by making the overall potential of the wafer 2 positive in a first inter-step after the cleaning process, by making the overall potential of the wafer 2 zero when cumulated plasma formation time or processing time or the number of processed wafers has increased and exceeded a prescribed value, and further making the overall potential of the wafer 2 negative when the cumulated time or the number of wafers has increased and exceeded a threshold value.

As an aspect of adjusting the overall potential of the wafer 2 according to a positively-charged ratio and a negatively-charged ratio among particles floating in the processing chamber 1 involved in increase in the cumulated time and number of wafers in processing like this, the following are considered as shown in FIG. 9: increasing or decreasing the overall potential of the wafer 2 in the inter-steps in the same way, and making it a prescribed value per inter-step.

The lowest graph in FIG. 9 shows an example of reducing the potential of the wafer 2 in the same way over a plurality of steps by a solid line, and an example of keeping the potential at a prescribed value different per inter-step and reducing the prescribed value according to increase in the number of wafers by a dashed line. FIG. 9 is a graph showing change in overall potential of the wafer adjusted according to increase in the cumulated time and or the number of wafers in processing in the plasma processing apparatus of the embodiment shown in FIG. 1. All the examples can provide effects to reduce dusts but the embodiment of changing the potential in the same manner provides larger effects. On the other hand, when the potential is changed in the same manner, it requires exact adjusting in order to gain sufficient reduction effects.

In the above described examples, explanation is given about examples in which it is possible to predict places where particles causing dusts and floating in the processing chamber 1 break loose or be peeled off and a state such as a balance of polarities in which those particles are charged. On the other hand, an example of setting the potential of the wafer 2 in the inter-steps when prediction of charged states of dusts is difficult will be explained using FIG. 10.

First, etching to manufacture a semiconductor device is a process of etching that comprises four processing steps and stops plasma formation in all three periods between previous steps and next steps (inter-steps) in the same manner as the embodiment shown in FIG. 1. Before starting to process a wafer 2 for semiconductor device manufacturing, a wafer 2 for dust inspection is attracted to and held on the stage electrode 4 in advance, a process of etching comprising steps 1 to 4 is conducted under the same sort of condition as the processing of the wafer 2 for semiconductor device manufacturing, and the number of dusts that have dropped on the wafer for dust inspection is counted. Furthermore, in the measurement, the overall potential of the wafer 2 is made 0 or a value approximate to a degree regarded as 0 in each of the inter-steps 1, 2, 3 between previous and next processing steps.

Next, another wafer for dust inspection is held on the stage electrode 4, potential of the wafer is made positive during the inter-step 1 and 0 during the inter-steps 2, 3, and the number of dusts attaching to the wafer for inspection is counted by conducting the process of etching to manufacture a semiconductor device in the same manner as the previous measurement. Next, potential of the wafer during the inter-step 1 is made negative, etching is conducted in the same manner, and the number of dusts attaching to the wafer for inspection is counted.

Next, the process of etching is conducted under a condition that the potential of the wafer is made 0 during the inter-steps 1 and 3, and two conditions that the potential of the wafer is changed to positive and negative during the inter-step 2, and the number of dusts attaching to the wafer for inspection is counted. Furthermore, in the same manner, the process of etching is conducted under a condition that the potential of the wafer is made 0 during the inter-steps 1 and 2, and two conditions that the potential of the wafer is changed to positive and negative during the inter-step 3, and the number of dusts attaching to the wafer for inspection is counted.

FIG. 10 shows a table summarizing results of the above-described measurements. From the results of the measurements, the potential of the wafer 2 in each inter-step is set so that the number of particles attaching to the wafer 2 will be smaller. Optimal wafer potential is obtained for each inter-step, and this potential is applied to actual mass production. In addition, also in a time from the wafer 2 being carried in and mounted on the stage electrode 4 to starting processing of the step 1, it is desirable to adjust voltage of the wafer 2 to an optimal value.

In the embodiment described above, operation in the plasma processing apparatus, such as transportation of the wafer 2, handing it over to the stage electrode 4, start and cancel of electrostatic chuck, plasma formation and extinction, and start and stop of supplying high-frequency power for bias formation, and adjustment of magnitude of voltage supplied to the electrode 30 for electrostatic chuck are conducted on the basis of a command signal from the unshown control device. The control device comprises therein: a computing unit such as a microprocessor; storage devices such as a DRAM, flash ROM, hard disk, or CD-ROM storing a program in which algorithm for the computing unit to calculate an operation command signal is written and data based on which calculation of the above-described operation is performed; a sensor for detecting states of each part and operation of the plasma processing apparatus operating on the basis of a command signal transmitted and received; and an interface with the outside for transmitting and receiving signals, and they are connected in a manner of being able to transmit and receive signals by wireline or wireless.

In addition, there is a possibility that places where particles causing dusts occur and their composition will change due to change over a long time of a state of a surface such as fluctuation of the amount of attachment to the inner wall of the processing chamber 1. Therefore, processing of a plurality of wafers 2 may be conducted consecutively while the measurements are conducted multiple times with an interval appropriately determined beforehand, and setting values of voltage of the wafer during inter-steps are updated.

In the embodiment and variant example described above, explanation is given about effective magnetic field discharge-type plasma processing apparatuses, the present invention is not limited to such plasma forming means. Also in a plasma processing apparatus by other plasma forming means, for a plasma processing apparatus in which places where dusts occurs, their material, and composition due to variation of distribution of potential of an inner wall change according to increase in cumulated time and the number of wafers in wafer processing, an action and effects of the embodiments of reducing the quantity of particles attaching to the wafer are produced by adjusting the overall potential of the wafer taking into consideration the charged balance of floating particles in a plurality of periods between processing steps in which formation of plasma is stopped.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing method comprising:
mounting a processing object wafer on an upper surface of a stage arranged inside of a vacuum chamber and at a pressure-reduced inner side of the vacuum chamber;
supplying power to an electrode arranged at an upper part of the stage to electrostatically attract and hold the wafer on the upper surface of the stage; and
forming plasma in the processing chamber and supplying high-frequency power to the stage to conduct processing of the wafer,
wherein the method includes a plurality of processing steps of conducting processing of the wafer under different conditions and a plurality of periods when formation of plasma is stopped between the processing steps,
wherein voltage supplied to the electrode is changed according to a balance of respective polarities of particles floating and charged in the processing chamber in each period when formation of the plasma is stopped.

2. The plasma processing method according to claim 1, wherein the quartz plate constitutes a ceiling surface of the processing chamber, and on a surface of a quartz cylinder member arranged above the upper surface of the stage and constituting an inner wall of the processing chamber, and
wherein a potential formed on the wafer is reduced over elapse of time by voltage supplied to the electrode in the plurality of periods when plasma is stopped.

3. The plasma processing method according to claim 1, wherein potential formed on the wafer by voltage supplied to the electrode is reduced along with increase in a processed number of the wafers in the plurality of periods when plasma is stopped.

4. The plasma processing method according to claim 2, wherein potential formed on the wafer by voltage supplied to the electrode is reduced along with increase in a processed number of the wafers in the plurality of periods when plasma is stopped.

* * * * *